(12) United States Patent
Miyoshi

(10) Patent No.: US 10,749,484 B2
(45) Date of Patent: Aug. 18, 2020

(54) LOAD BOX AND SOUND QUALITY IMPROVING METHOD

(71) Applicant: Roland Corporation, Shizuoka (JP)

(72) Inventor: Naoshi Miyoshi, Shizuoka (JP)

(73) Assignee: Roland Corporation, Shizuoka (JP)

( * ) Notice: Subject to any disclaimer, the term of this patent is extended or adjusted under 35 U.S.C. 154(b) by 0 days.

(21) Appl. No.: 16/677,601

(22) Filed: Nov. 7, 2019

(65) Prior Publication Data

US 2020/0153392 A1     May 14, 2020

(30) Foreign Application Priority Data

Nov. 12, 2018   (JP) ................................. 2018-212267

(51) Int. Cl.
| | |
|---|---|
| H04R 25/00 | (2006.01) |
| H03G 3/00 | (2006.01) |
| H03F 3/181 | (2006.01) |
| H03F 3/68 | (2006.01) |
| H04R 3/04 | (2006.01) |
| H03G 5/16 | (2006.01) |

(52) U.S. Cl.
CPC .............. *H03F 3/181* (2013.01); *H03F 3/68* (2013.01); *H03G 5/165* (2013.01); *H04R 3/04* (2013.01); *H03F 2200/03* (2013.01); *H03F 2200/387* (2013.01)

(58) Field of Classification Search
CPC ........... H03F 2200/03; H03F 2200/387; H03F 3/181; H03F 3/68; H03G 5/165; H04R 3/04
USPC ................. 381/69.1, 104, 107, 319
See application file for complete search history.

(56) References Cited

U.S. PATENT DOCUMENTS

| | | | | |
|---|---|---|---|---|
| 4,066,975 A | * | 1/1978 | Key ......................... | H03F 1/36 330/122 |
| 4,117,418 A | * | 9/1978 | Hoglund ............... | H03F 1/0244 330/124 R |
| 4,363,934 A | | 12/1982 | Scholz | |

(Continued)

FOREIGN PATENT DOCUMENTS

WO        8800410        1/1988

OTHER PUBLICATIONS

"Search Report of Europe Counterpart Application", dated Apr. 15, 2020, pp. 1-9.

(Continued)

*Primary Examiner* — Khai N. Nguyen
(74) *Attorney, Agent, or Firm* — JCIPRNET

(57) ABSTRACT

To improve voice sound quality using a vacuum tube amplifier. A reactive load that has impedance characteristics, in which impedance characteristics in a first frequency band includes a first impedance characteristic pattern selected from a plurality of first impedance characteristic pattern candidates on the basis of a type of a vacuum tube amplifier, and impedance characteristics in a second frequency band includes a second impedance characteristic pattern selected from a plurality of second impedance characteristic patterns on the basis of the type of the vacuum tube amplifier, outputs a signal that responds to a sound signal output from the vacuum tube amplifier in accordance with the impedance characteristics and performs correction on an output signal of the reactive load.

20 Claims, 4 Drawing Sheets

(56) References Cited

U.S. PATENT DOCUMENTS

| | | | | |
|---|---|---|---|---|
| 5,148,116 | A | * | 9/1992 | Robinson .............. H03F 3/3076 |
| | | | | 330/268 |
| 5,420,541 | A | * | 5/1995 | Upton ................... H03F 1/0288 |
| | | | | 330/286 |
| 5,859,565 | A | * | 1/1999 | Reiffin ................... H03F 3/181 |
| | | | | 330/119 |
| 5,912,585 | A | * | 6/1999 | Yamada ................. H03F 3/181 |
| | | | | 330/118 |
| 6,111,961 | A | * | 8/2000 | Hedrick ................ G10H 3/186 |
| | | | | 381/120 |
| 7,009,466 | B1 | * | 3/2006 | Fiedziuszko .............. H01P 5/04 |
| | | | | 333/100 |
| 10,020,781 | B2 | * | 7/2018 | Fryette .................... H03F 1/307 |
| 2004/0012440 | A1 | * | 1/2004 | Hughes ............... H03G 3/3005 |
| | | | | 330/85 |
| 2005/0123144 | A1 | * | 6/2005 | Wallace ............... H04R 29/001 |
| | | | | 381/56 |
| 2006/0251275 | A1 | * | 11/2006 | Ackley ................. G10H 3/186 |
| | | | | 381/118 |
| 2017/0207754 | A1 | * | 7/2017 | Fryette ................... H03F 1/565 |

OTHER PUBLICATIONS

Two Notes Audio Engineering, "Torpedo Reload User's Manual," accessed Nov. 2012, Available at: https://images.thomann.de/pics/atg/atgdata/document/manual/en_manual_torpedo_reload.pdf.

\* cited by examiner

| First adjustment unit | Second adjustment unit | Vacuum tube amplifier | Cabinet |
|---|---|---|---|
| L1 | L2 | A1 | Type 1 |
| L1 | M2 | A2 | Type 2 |
| L1 | H2 | A3 | Type 3 |
| M1 | L2 | A4 | Type 4 |
| M1 | M2 | A5 | Type 5 |
| M1 | H2 | A6 | Type 6 |
| H1 | L2 | A7 | Type 7 |
| H1 | M2 | A8 | Type 8 |
| H1 | H2 | A9 | Type 9 |

LOAD BOX AND SOUND QUALITY IMPROVING METHOD

CROSS REFERENCE TO RELATED APPLICATIONS

This application claims the priority benefit of Japanese Patent Application No. 2018-212267, filed on Nov. 12, 2018. The entirety of the above-mentioned patent application is hereby incorporated by reference herein and made a part of this specification.

BACKGROUND

Technical Field

The disclosure relates to a load box and a sound quality improving method.

Description of Related Art

In order to output a suitable guitar sound using a vacuum tube amplifier (also referred to as a tube amplifier), it is necessary to distort the sound with the vacuum tube amplifier, and the volume thus becomes large. In an environment in which outputting of large volume audio from a speaker cabinet is not allowed (such as a home), a device called a load box is connected to the vacuum tube amplifier.

A load box has a dummy load (pseudo load) that is called a reactive load. The reactive load reactively responds to a signal from a vacuum tube amplifier with impedance characteristics that are similar to those of a speaker cabinet with impedance that changes in responding to an input frequency. Utilization of the load box makes it possible to avoid a loss of warm and dynamic sound quality achieved in a case in which a vacuum tube amplifier is used as compared with a case in which an attenuator or the like is used as a dummy load. The related art of the disclosure includes the technology disclosed in Patent Document 1 below.

PATENT DOCUMENTS

[Patent Document 1] U.S. Pat. No. 4,363,934

A reactive load in a load box in the related art uses one type of fixed impedance characteristics. Therefore, in a case in which impedance characteristics of a vacuum tube amplifier do not match impedance characteristics of the reactive load, changes in sound tone that a user does not intend may occur.

The disclosure provides a load box and a sound quality improving method that enables improvement in sound quality of audio using a vacuum tube amplifier.

SUMMARY

According to an embodiment of the disclosure, there is provided a load box including: a reactive load that outputs an audio signal that responds to an audio signal output from a vacuum tube amplifier with impedance characteristics that simulated impedance characteristics of a speaker cabinet; an operation element that adjusts impedance characteristics of the reactive load in a first frequency band into a first impedance characteristic pattern selected from a plurality of first impedance characteristic pattern candidates at least on the basis of a type of the vacuum tube amplifier and adjusts impedance characteristics of the reactive load in a second frequency band that is higher than the first frequency band into a second impedance characteristic pattern selected from a plurality of second impedance characteristic pattern candidates at least on the basis of the type of the vacuum tube amplifier; and a correction unit that performs correction processing on an output signal of the reactive load that has impedance characteristics including the first impedance characteristic pattern and the second impedance characteristic pattern.

According to another embodiment of the disclosure, there is provided a load box including: a reactive load that is connected to a vacuum tube amplifier; an operation element of the reactive load; and a correction unit that corrects an output signal of the reactive load in response to an operation of the operation element.

According to yet another embodiment of the disclosure, there is provided a sound quality improving method, the sound quality improving method includes outputting a signal that responds to an audio signal by using a reactive load, wherein the audio signal is output from a vacuum tube amplifier in accordance with impedance characteristics that simulated impedance characteristics of a speaker cabinet, and that the reactive load has the impedance characteristics in which impedance characteristics in a first frequency band include a first impedance characteristic pattern selected from a plurality of first impedance characteristic pattern candidates on the basis of a type of the vacuum tube amplifier, and impedance characteristics in a second frequency band that is higher than the first frequency band include a second impedance characteristic pattern selected from a plurality of second impedance characteristic patterns on the basis of the type of the vacuum tube amplifier; and performing correction on an output signal of the reactive load.

DESCRIPTION OF THE EMBODIMENTS

Hereinafter, a load box and a sound quality improving method according to an embodiment will be described with reference to drawings. The configuration of the load box according to the embodiment is one example, and the load box is not limited to this configuration. In the embodiment, an example in which a guitar is connected to a vacuum tube amplifier and the vacuum tube amplifier is further connected to the load box will be described. The guitar is an example of an instrument and, the instrument can be a stringed instrument other than a guitar or an instrument other than stringed instrument. In the specification, an audio signal includes a sound signal. Audio includes, in addition to instrument sounds and the human voice (voice), sounds other than instrument sounds and voice.

<Overall Configuration>

Figure 1:
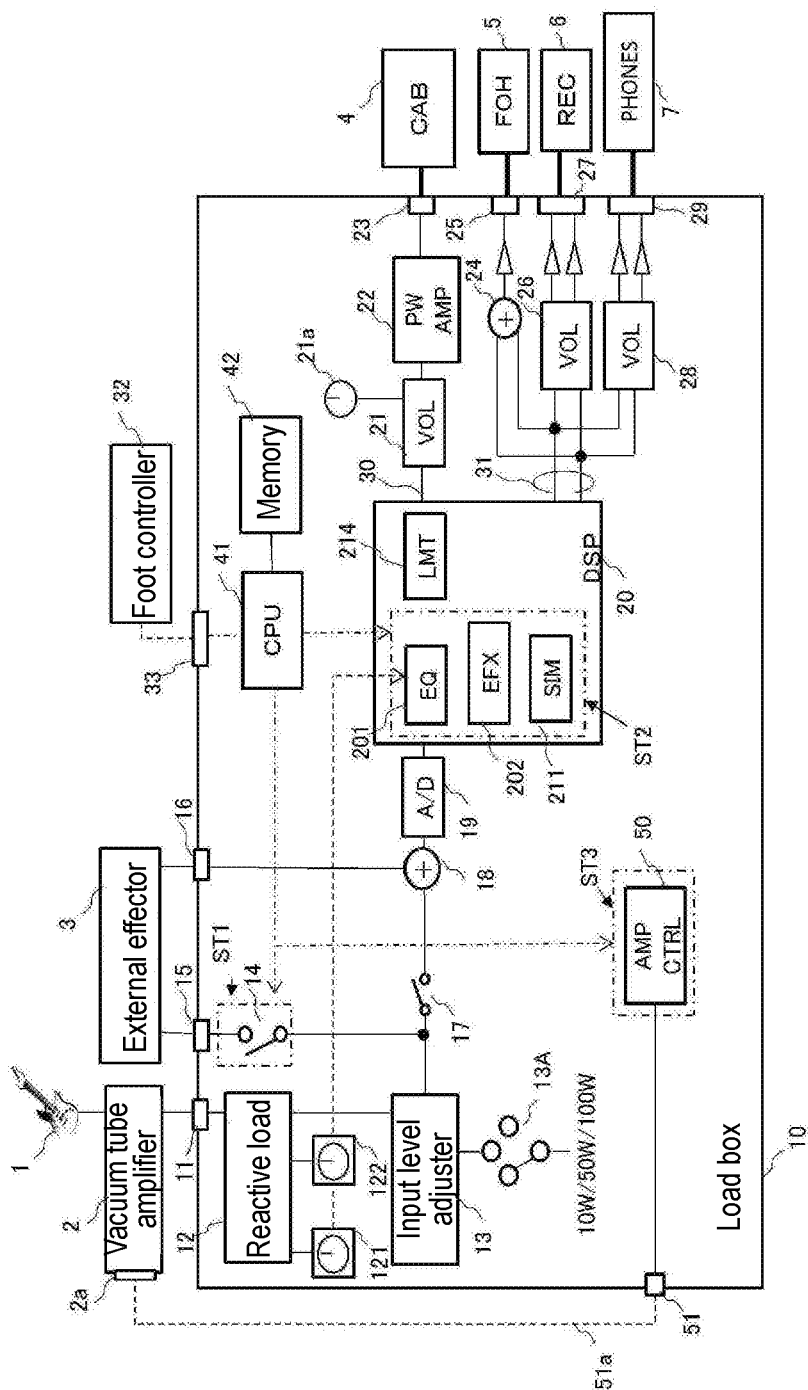
FIG. 1 illustrates a configuration example of a load box according to an embodiment.

FIG. 1 illustrates a configuration example of the load box according to the embodiment. In FIG. 1, an electric guitar 1

(hereinafter, simply referred to as a "guitar 1") is connected to a vacuum tube amplifier (head amplifier) 2, and the vacuum tube amplifier 2 is connected to a load box 10 via a terminal 11. The load box 10 includes a transmission terminal 15 and a reception terminal 16 and is connected to an effector (external effector 3) outside the load box 10 via the transmission terminal 15 and the reception terminal 16.

In addition, the load box 10 includes a terminal 23, a terminal 25, a terminal 27, and a terminal 29. The terminal 23 is a terminal for a speaker, and the load box 10 is connected to a speaker cabinet (CAB) 4 via the terminal 23. A front-of-house (FOH) 5 is connected to the terminal 25. The FOH 5 is a loudspeaker to which audio signals from a plurality of instruments including the guitar 1 are input, and which adjusts signal levels of the audio signals and outputs the audio signals to a public address (PA). A recorder (REC) 6 is connected to the terminal 27. Headphones (PHONES) 7 are connected to the terminal 29.

<Reactive Load>

The load box 10 includes a reactive load 12 that is connected to the vacuum tube amplifier 2 via the terminal 11. The reactive load 12 changes an impedance in accordance with a frequency of an audio signal input from the vacuum tube amplifier 2. That is, the reactive load 12 outputs a signal that responds in accordance with impedance characteristics that are similar to impedance characteristics of the speaker cabinet 4 that is connected to the load box 10 using the terminal 23.

Figures 2, 3:
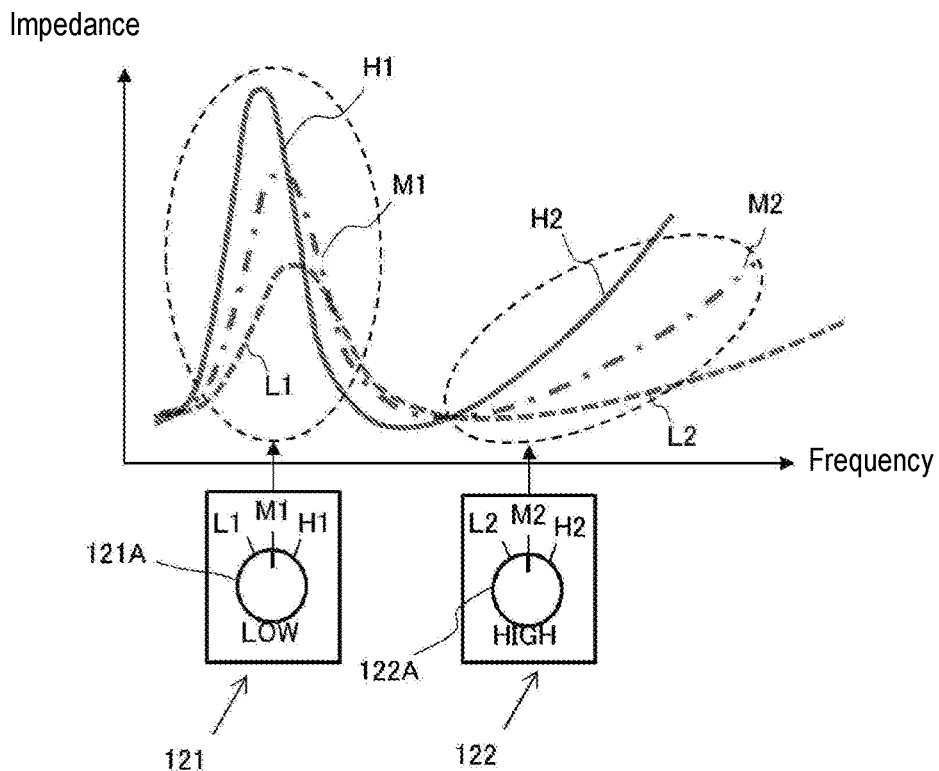
FIG. 2 is an explanatory diagram of adjustment of impedance characteristics of a reactive load.
FIG. 3 is a table illustrating correspondence of a first impedance characteristic pattern, a second impedance characteristic pattern, a vacuum tube amplifier, and a speaker cabinet.

FIG. 2 is an explanatory diagram of a method for adjusting impedance characteristics of the reactive load. The impedance characteristics are represented by a graph in which a vertical axis represents impedance and a horizontal axis represents an impedance response (frequency). The impedance characteristics form a curve with a resonance frequency at a peak in a first frequency band corresponding to a low frequency, and impedance rises in a second frequency band corresponding to a higher frequency than the first frequency band. This is because a coil of the speaker cabinet 4 has a characteristic that high frequencies are not easily transmitted therethrough. The reactive load 12 is an electric circuit formed to have impedance characteristics that are similar to the impedance characteristics of the speaker cabinet 4.

In regard to first impedance characteristics in the first frequency band in the impedance characteristics of the reactive load 12 according to the embodiment, a plurality of patterns, that is, a plurality of first impedance characteristic pattern candidates, is prepared. Also, in regard to the second impedance characteristics in the second frequency band of the reactive load 12, a plurality of patterns, that is, a plurality of second impedance characteristic pattern candidates, is prepared.

In the embodiment, three first impedance characteristic pattern candidates are prepared as the plurality of first impedance characteristic pattern candidates. The three first impedance characteristic pattern candidates have mutually different resonance widths (bands), resonance frequencies, and impedance peaks (resonance). However, it is only necessary for at least one of these to be different among the first impedance characteristic pattern candidates. In the example illustrated in FIG. 2, first impedance characteristic pattern candidates "L1" (referred to as a pattern L1), "M1" (referred to as a pattern M1), and "H1" (referred to as a pattern H1) are provided in order from the lowest peak.

Also, three second impedance characteristic pattern candidates are prepared as the plurality of second impedance characteristic pattern candidates. How the impedance rises (presence) differs among the three second impedance characteristic pattern candidates. In the example illustrated in FIG. 2, the second impedance characteristic pattern candidates "L2" (referred to as a pattern L2), "M2" (referred to as a pattern M2), and "H2" (referred to as a pattern H2) are provided in order from the lowest degree of rising.

Also, the respective upper limits and lower limits of the first and second frequency bands can be appropriately set. Also, the number of first and second impedance characteristic candidate patterns may be larger or smaller than three.

The load box 10 includes a first adjuster 121 (an example of the first adjustment unit) and a second adjuster 122 (an example of the second adjustment unit) as examples of the operation element of the reactive load 12. The first adjuster 121 includes an adjustment finger grip 121A provided with a plurality of ranges with which any of the pattern L1, the pattern M1, and the pattern H1 can be selected and an electric circuit that sets impedance characteristics in the first frequency band to the selected one of the pattern L1, the pattern M1, and the pattern H1. By a user of the load box 10 adjusting the adjustment finger grip 121A to any of the ranges for the pattern L1, the pattern M1, and the pattern H1, a circuit configuration that forms the reactive load 12 changes, and the impedance characteristics in the first frequency band become the selected one of the pattern L1, the pattern M1, and the pattern H1.

The second adjuster 122 includes an adjustment finger grip 122A provided with a plurality of ranges with which any of the pattern L2, the pattern M2, and the pattern H2 can be selected and an electric circuit that sets impedance characteristics in the second frequency band to the selected one of the pattern L2, the pattern M2, and the pattern H2 in accordance with the selected range. By the user of the load box 10 adjusting the adjustment finger grip 122A to any of the pattern L2, the pattern M2, and the pattern H2, the circuit configuration that forms the reactive load 12 changes, and the impedance characteristics in the second frequency band become the selected one of the pattern L2, the pattern M2, and the pattern H2.

FIG. 3 is a table illustrating correspondence of a first impedance characteristic pattern (a pattern selected by the first adjuster 121), a second impedance characteristic pattern (a pattern selected by the second adjuster 122), a type of the vacuum tube amplifier 2, and a type of the speaker cabinet.

The table illustrated in FIG. 3 illustrates types of the speaker cabinet 4 that have impedance characteristics equivalent to or adapted to impedance characteristics of the vacuum tube amplifier 2 (types A1 to A9). The table illustrates that the impedance characteristics of the speaker cabinet 4 of each type are obtained by combining a first impedance characteristic pattern and a second impedance characteristic pattern through manual operations of the first adjuster 121 and the second adjuster 122.

That is, it is possible to change (switch) the impedance characteristics that the reactive load 12 has to ones adapted to (matching) the vacuum tube amplifier 2 that is connected to the load box 10, by switching patterns that the adjustment finger grip 121A and the adjustment finger grip 122A each indicates. In this manner, it is possible to suppress a change in sound tone that the user does not intend, which is caused when the impedance characteristics of the vacuum tube amplifier 2 do not match or are not adapted to the impedance characteristics of the reactive load. That is, it is possible to improve sound quality.

Also, a configuration in which two operation elements, namely the first adjuster 121 and the second adjuster 122, are provided is exemplified in the embodiment. A configuration in which a combination of a first impedance characteristic candidate and a second impedance characteristic candidate is selected through an operation of one operation element (adjuster) may be used instead of this configuration. A case in which three adjusters are included as operation elements is also conceivable.

<Input Level Adjuster>

In FIG. 1, an output signal of the reactive load 12 is input to an input level adjuster 13. The input level adjuster 13 is provided in order to suppress an increase in volume due to a signal distortion caused by the vacuum tube amplifier 2 and includes an attenuator that reduces a level (electric power) of the output signal of the reactive load 12. The input level adjuster 13 has a power switching switch 13A. The electric power is set in accordance with an electric power output by the vacuum tube amplifier that is connected to the load box 10. In the embodiment, the switching switch 13A can switch the power to any of 10 W, 50 W, and 100 W. The switching switch 13A may be manually operated or may be automatically operated.

<External Effector>

As configurations related to an external effector 3, the load box 10 includes a switch 14, a transmission terminal 15, a reception terminal 16, a switch 17, and a mixer (adder) 18. An input terminal of the switch 17 is connected to an output terminal of the input level adjuster 13. An input terminal of the switch 14 is connected to a signal line between the input level adjuster 13 and the switch 17, and an output terminal of the switch 14 is connected to the transmission terminal 15. Each of the output terminal of the switch 17 and the reception terminal 16 is connected to the mixer 18.

In a case in which the external effector 3 is used, the switch 14 is turned on (closed state), and an output signal of the input level adjuster 13 is transmitted from the transmission terminal 15 to the external effector 3 through the switch 14. The external effector 3 adds predetermined effects such as a delay, reverb, and tremolo to the output signal of the input level adjuster 13, that is, an audio signal of the guitar 1. The output signal of the external effector 3 (the audio signal with the effect added thereto) is received by the reception terminal 16 and is then input to the mixer 18.

The switch 17 inputs the output signal of the input level adjuster 13 to the mixer 18 when the switch 17 is turned on (closed state). Therefore, if the switch 14 is turned on when the switch 17 is turned on, the mixer 18 outputs a signal obtained by mixing an original signal output from the input level adjuster 13 and a signal obtained by the external effector 3 adding an effect to the original signal. Meanwhile, when the switch 17 is turned on and the switch 14 is turned off, the mixer 18 outputs the original signal output from the input level adjuster 13. Meanwhile, when the switch 17 is turned off and the switch 14 is turned on, the mixer 18 outputs the output signal of the external effector 3.

Turning on and off of the switch 14 and the switch 17 are controlled depending on whether or not it is necessary to add an effect by the external effector 3 or the type of effect to be added by the external effector 3. Also, the turning on and off of the switch 14 and the switch 17 may be controlled in accordance with a combination of the patterns selected by the first adjuster 121 and the second adjuster 122 (impedance characteristics of the reactive load 12). With this configuration, it is possible to convert a signal of the vacuum tube amplifier 2 including a distortion into a signal in a low signal level (electric power) with the input level adjuster 13 and to add an effect to the signal using the external effector 3.

<DSP>

An output terminal of the mixer 18 is connected to an analog/digital converter (A/D) 19, and the A/D 19 is connected to a digital signal processor (DSP) 20. In this manner, any of an output signal (an audio signal (original signal) from the vacuum tube amplifier) of the input level adjuster 13, a signal (effect added signal) obtained by adding an effect to the original signal using the external effector 3, and a signal (mixing signal) obtained through mixing of the original signal and the effect added signal is digital-converted and input to the DSP 20 as an input audio signal. The DSP 20 has a memory and operates as a device with the following configurations by executing a program stored in the memory.

<<Equalizer>>

Figure 4:
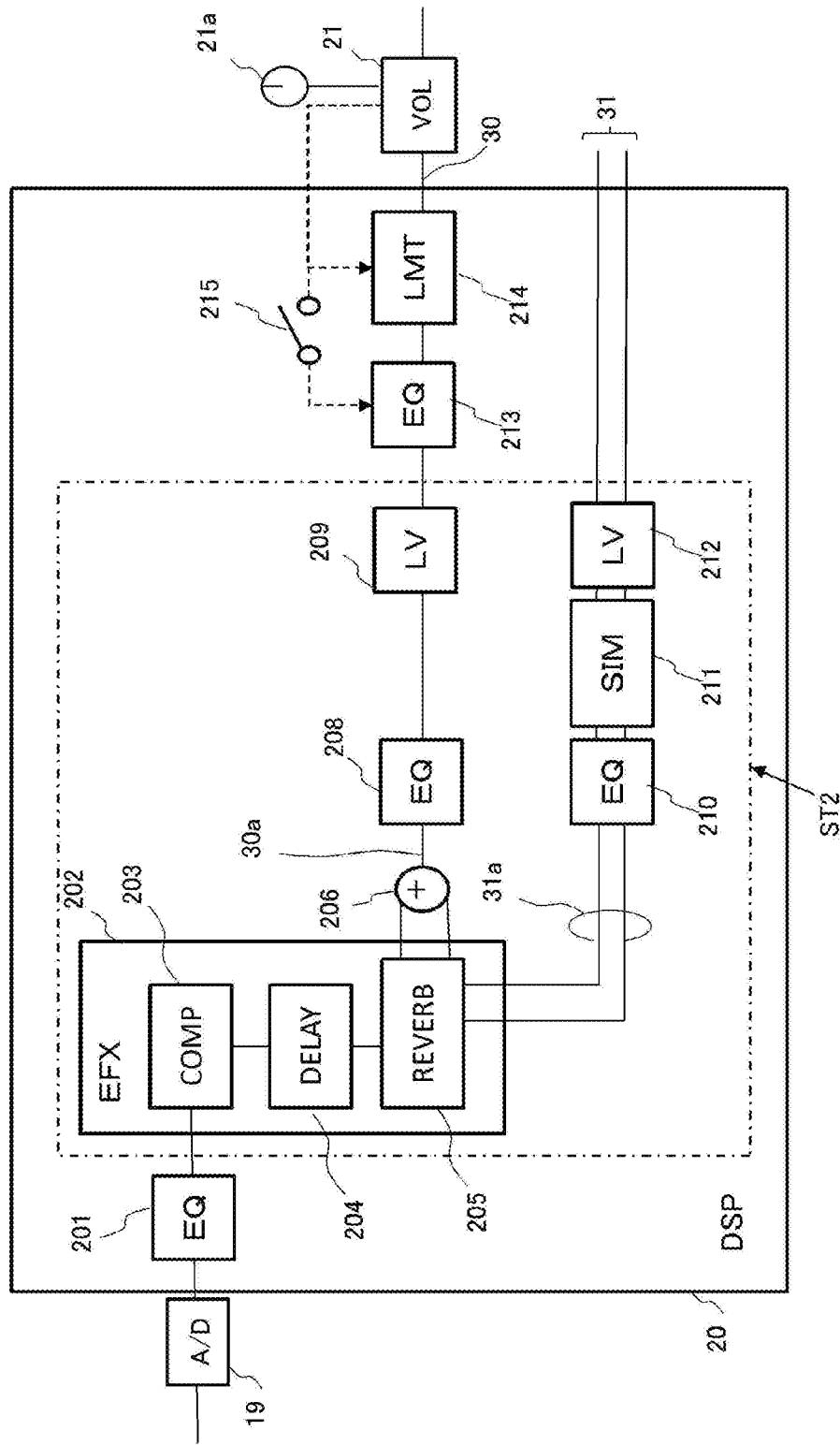
FIG. 4 is a configuration example of DSP illustrated in FIG. 1.

As illustrated in FIG. 1 and FIG. 4, the DSP 20 includes an equalizer (EQ) 201 to which an output signal of the A/D 19 is input. Information indicating a combination of the first and second impedance characteristic patterns (that is, the impedance characteristics of the reactive load 12) selected by the first adjuster 121 and the second adjuster 122 is input to the equalizer 201 as a control signal. The equalizer 201 has a plurality of changed patterns of frequency characteristics of the input audio signal in accordance with the aforementioned combination and changes frequency characteristics of the input audio signal in accordance with a changed pattern corresponding to the combination.

Figure 5:
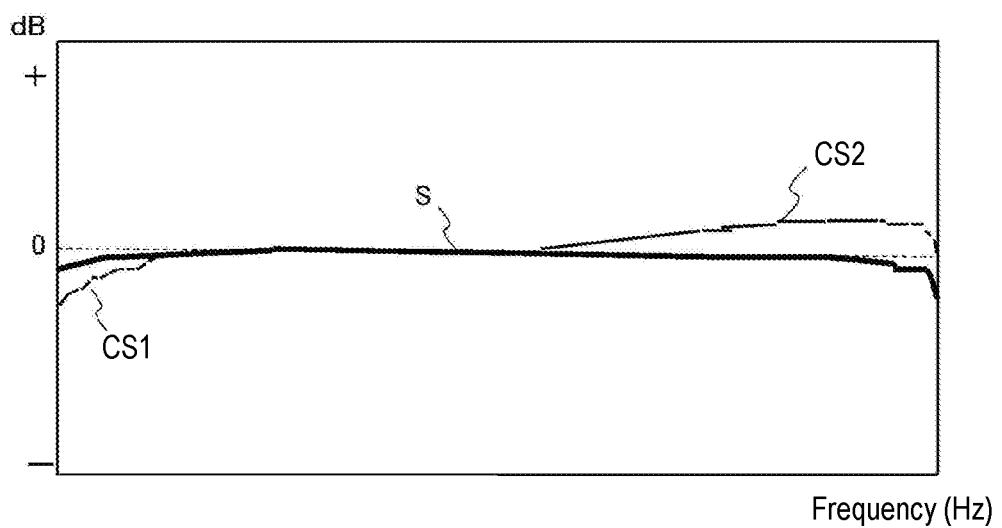
FIG. 5 illustrates an example of correction (change in frequency characteristics) using an equalizer.

FIG. 5 illustrates an example of a change in frequency characteristics using the equalizer 201. The equalizer 201 performs a change in frequency characteristics in accordance with the first impedance characteristic pattern on an input audio signal (original signal) S and generates a signal CS1 with increased or decreased amplitude from the signal S in regard to a low frequency range. Also, the equalizer 201 performs a change in frequency characteristics in accordance with the second impedance characteristic pattern on the original signal S and generates a signal CS2 with increased or decreased amplitude from the signal S in regard to a high frequency range.

In this manner, the equalizer 201 can generate a signal with changed frequency characteristics in the low range and the high range of the original signal S on the basis of the first and second impedance characteristic patterns. That is, the equalizer 201 performs a correction processing so as to improve the sound quality of the audio signal output from the vacuum tube amplifier 2 (the signal that the reactive load 12 has output as a response). In this manner, it is possible to improve (upgrade) the sound quality as compared with a case in which only the reactive load 12 of the reactive load 12 and the equalizer 201 is used. The equalizer 201 is an example of the correction unit.

<<Effector>>

The DSP 20 includes an effector (EFX) 202 to which an output signal of the equalizer 201 is input. The effector 202 has a compressor (COMP) 203, a delay (DELAY) 204, and a reverb (REVERB) 205 in one example. However, types of effect that the effector 202 has are not limited thereto.

Effects of the compressor 203, the delay 204, and the reverb 205 are added to the audio signal input to the effector 202. However, it is not necessary for all the effects of the compressor 203, the delay 204, and the reverb 205 to be added to the audio signal input to the effector 202, and it is possible to employ a configuration in which at least one effected selected from these is added. Also, in a case in which it is not necessary to add any effect, the original audio signal may be output from the effector 202.

An output of the reverb 205 is output as an output of the effector 202 to two systems. One of the two systems is a first system (speaker-out) for outputting audio from the speaker cabinet 4 (FIG. 1). The other one system is a second system (line-out) that outputs audio from the FOH 5 or records audio in the REC 6.

<First System (Speaker-Out)>

As illustrated in FIG. 1 and FIG. 4, the load box 10 includes a mixer 206, a signal line 30a, an equalizer (EQ) 208, a level adjuster (LV) 209, an equalizer (EQ) 213, a limiter (LMT) 214, a volume (VOL) 21, and a power amplifier (PW AMP) 22, which are connected in series, as configurations related to the first system. The mixer 206 is connected to the effector 202 (reverb 205), and the audio signal amplified by the power amplifier 22 is connected to the speaker cabinet 4 via the terminal 23.

In the aforementioned configurations related to the first system, the equalizer 208, the level adjuster 209, the equalizer (EQ) 213, and the limiter (LMT) 214 are realized by the DSP 20.

The equalizer 208 and the level adjuster 209 performs a change in frequency characteristics and an adjustment of the signal level that are required for the output signal from the effector 202. The equalizer 213 performs a necessary change in frequency characteristics on the level adjusted signal. The equalizer 213 can operate as a loudness correction unit that performs a loudness correction. The loudness correction is turned on and off by turning on and off the switch 215. The switch 215 may be turned on and off through a manual operation or an operation other than the manual operation. Here, the volume 21 is an adjuster of the volume of the audio output from the speaker cabinet 4, and an adjuster (adjustment finger grip 21a) for manually operating the volume is connected to the volume 21. In a state in which the switch 215 is turned on, the correction amount of the loudness correction performed by the equalizer 213 increases in accordance with an increase or decrease in volume (information indicating the volume) through an operation of the adjustment finger grip 21a. That is, the equalizer 213 strengthens a low sound range and a high sound range when the volume is small, and a degree of strengthening is reduced with a volume increase.

The limiter 214 adjusts an amplification rate at the power amplifier 22 in regard to the input signal to the limiter 214 such that no distortion occurs in the signal due to the amplification at the power amplifier 22. The limiter 214 is an example of the control unit. A threshold value for adjusting the amplification rate is adjusted by a predetermined control input. For example, a result of adjusting the volume through an operation of the adjuster (adjustment finger grip 21a) of the volume 21 (information indicating the volume of the audio signal connected to the speaker cabinet 4) is used as the predetermined control input, and the threshold value of the limiter 214 is changed in accordance with the result of the adjustment. In this manner, a configuration in which each of the loudness correction and the change in threshold value of the limiter 214 is performed through adjustment of the volume 21 (the operation of the adjustment finger grip 21a) is employed in the embodiment. However, the loudness correction and the change in threshold value may be performed by different operation elements.

<Second System>

As illustrated in FIG. 1 and FIG. 4, the load box 10 includes a signal line 31a, an equalizer (EQ) 210, a simulator (SIM) 211, and a level adjuster (LV) 212, which are connected in series, as configurations related to the second system. The output signal from the level adjuster 212 is connected to each of the mixer 24, the volume (VOL) 26, and the volume (VOL) 28 via the signal line 31. The mixer 24 generates a monorail signal by performing mixing of left and right stereo signals. An output of the mixer 24 is connected to the FOH 5 via the terminal 25. A signal with a volume adjusted by the volume 26 is input to and recorded in a recorder 6 via the terminal 27. A signal with a volume adjusted by the volume 28 is input to the headphones 7 via the terminal 29 and is used to for allowing the user to listen to it.

The equalizer 213 performs a necessary change in frequency characteristics. The simulator 211 performs simulation related to a plurality of types of speaker cabinet and microphone registered in the load box 10. The simulator 211 simulates a speaker cabinet selected from the aforementioned plurality of types of speaker cabinet in regard to the audio signal input from the effector 202 (the output signal of the equalizer 210) and generates an audio signal (referred to as a speaker sound signal) in a case in which audio is output from the selected speaker cabinet. The number of types of speaker cabinet is a desired number, which is equal to or greater than two.

Also, the simulator 211 generates an audio signal (referred to as a microphone collected sound signal) that simulated a condition in which an audio output from the corresponding speaker cabinet 4 is collected with the microphone. The user can set which of the speaker sound signal, or the microphone collected sound signal, or both the speaker sound signal and the microphone collected signal is to be generated by the simulator 211 through a predetermined operation performed on the load box 10, and the simulator 211 generates the speaker sound signal, or the microphone collected sound signal, or both the speaker sound signal and the microphone collected signal in accordance with the setting performed on the simulator 211. The signal generated by the simulator 211 is output to the signal line 31, is output from the FOH 5, is recorded in the recorder 6, or is output from the headphones 7. With the aforementioned configuration, the audio signal that simulated an audio output from the selected speaker cabinet or the audio signal obtained by collecting the audio with the microphone can be generated, output, recorded, or the like. Also, the simulator 211 is an example of the generation unit.

<Control and Operation of Load Box>

As illustrated in FIG. 1, the load box 10 includes a CPU 41 and a memory 42. The memory 42 is an example of the storage unit and includes a main storage device and an auxiliary storage device. The main storage device is used as a storage region for programs and data, a work region of the CPU 41, or the like. The auxiliary storage device is used as a storage region for programs and data. The main storage device is a RAM, a ROM, or a combination of a RAM and a ROM, and the auxiliary storage device is a hard disk, an SSD, a flash memory, an EEPROM, or the like, for example.

The CPU 41 is an example of a processor and controls operations of the entire load box 10 by executing programs stored in the memory 42. For example, the CPU 41 performs an operation control for the simulator 211 of the DSP 20.

In addition, the CPU 41 controls use/non-use of the effector 202 and the external effector 3, mixing/non-mixing with the original signal, details of an effect, and the like by controlling turning on and off of the effector 202 in the DSP 20, the switch 14, and the switch 17. Each of the effector 202 and the external effector 3 is an example of the effect addition unit. Also, the CPU 41 is an example of the effect control unit. Processing that the CPU 41 performs may be realized using a plurality of processors or using an integrated circuit such as an FPGA.

Also, the CPU 41 controls operations of an amplifier controller (AMP CTRL) 50 and the like. The amplifier controller 50 is connected to a terminal 51, and the terminal 51 is connected to a channel switching terminal 2a of the vacuum tube amplifier 2 via a control line 51a. The vacuum tube amplifier 2 has, for example, a plurality of channels such as a clean channel and a read channel. The amplifier controller 50 sends a channel switching signal to the vacuum tube amplifier 2 via the terminal 51 and switches a channel of the vacuum tube amplifier 2. The amplifier controller 50 is an example of the channel control unit.

In FIG. 1 and FIG. 4, the switch 14 surrounded by the one-dotted chain line box ST1, the effector 202 surrounded by the one-dotted chain line box ST2, and the amplifier controller 50 surrounded by the one-dotted chain line box ST3 such as the simulator 211 are targets of setting parameter sets for which a plurality of parameters (parameter sets (corresponding to setting information)) is set for operations thereof. The parameter sets are set by the CPU 41. The memory 42 stores the plurality of parameter sets in regard to the respective setting targets such as the switch 14, the effector 202, the simulator 211, and the amplifier controller 50. In the embodiment, ten parameter sets can be stored in the memory 42. However, the number of parameter sets that can be stored may be smaller or larger than ten.

The load box 10 includes an operation unit 33, and the operation unit 33 includes an operation element such as a button. The user can input designation information for designating a setting target and a parameter set to be set for the setting target (setting information) through an operation of the operation unit 33. The designation information is provided to the CPU 41. Then, the CPU 41 reads a setting information corresponding to the designation information from the memory 42 and sets the read setting information for the setting target designated by the designation information. In this manner, a plurality of pieces of setting information for the effector 202 is stored in the memory 42 such that the CPU 41 can call setting that the user desires, for example. The same applies to the switch 14, the amplifier controller 50, and the simulator 211. The memory 42 is an example of the storage unit, and the CPU 41 is an example of the setting unit.

A foot controller 32, that is an example of the external device, is connected to the operation unit 33. The foot controller 32 is operated by a user's foot, and it is possible to input a control signal for switching a channel of the vacuum tube amplifier 2 to the CPU 41 through the operation. The CPU 41 gives a command for switching a channel to the amplifier controller 50 in accordance with the control signal, and the amplifier controller 50 switches a channel of the vacuum tube amplifier 2. In this manner, it is possible to switch a channel of the vacuum tube amplifier 2 through the operation of the foot controller 32.

In addition, the foot controller 32 can supply, to the CPU 41 of the load box 10, an ON/OFF signal of the switch 14 and an ON/OFF signal of the effector 202 in accordance with the operation, and the CPU 41 turns on and off the switch 14 (external effector 3) and the effector 202 in accordance with the ON/OFF signal.

Also, it is possible to supply the aforementioned designation information (designation of the setting target and the setting information) to the CPU 41 through the operation of the foot controller 32. In this manner, it is possible to change an effect to be added by the effector 202 and to change a speaker cabinet to be simulated by the simulator 211 through the operation of the foot controller 32.

<Effects of Embodiment>

The load box 10 according to the embodiment includes the reactive load 12 that outputs a signal that responds to an audio signal output from the vacuum tube amplifier 2 with impedance characteristics that simulated impedance characteristics of the speaker cabinet 4. Also, the load box 10 includes the first adjuster 121 (the operation element; corresponding to the first adjustment unit) for adjusting impedance characteristics of the reactive load 12 in the first frequency band into the first impedance characteristic pattern selected from the plurality of first impedance characteristic pattern candidates (L1, M1, and H1) at least on the type of vacuum tube amplifier 2. In addition, the load box 10 includes the second adjuster 122 (the operation element; corresponding to the second adjustment unit) for adjusting impedance characteristics of the reactive load 12 in the second frequency band that is higher than the first frequency band to the second impedance characteristic pattern selected from the plurality of second impedance characteristic pattern candidates (L2, M2, and H2) at least on the basis of the type of vacuum tube amplifier 2. Further, the load box 10 includes the equalizer 201 (corresponding to the correction unit) that performs a correction processing on an output signal of the reactive load 12 that has impedance characteristics including the first impedance characteristic pattern and the second impedance characteristic pattern.

In the embodiment, the equalizer 201 corrects sound quality of the output signal of the reactive load 12 on the basis of the first impedance characteristic pattern and the second impedance characteristic pattern. That is, the equalizer 201 changes frequency characteristics of the output signal of the reactive load 12 on the basis of the first impedance characteristic pattern and the second impedance characteristic pattern. In this manner, it is possible to improve or upgrade the sound quality of an audio by obtaining an environment that is similar to the environment in which the reactive load 12 that simulates impedance characteristics that are similar to the impedance characteristics of the speaker cabinet 4 adapted to or matching the vacuum tube amplifier 2 and correcting the output signal of the reactive load 12.

In addition, the load box 10 includes the effector 202 that adds an effect to the audio signal corrected by the equalizer 201, the power amplifier 22 that amplifies the audio signal output from the effector 202, and the limiter 214 (corresponding to the control unit) that controls an amplification rate of each of the audio signal corrected by the equalizer 201 and the audio signal obtained by adding the effect to the audio signal corrected by the equalizer 201 to an amplification rate at which no distortion is caused by the power amplifier 22 in accordance with a predetermined control input (for example, the first and second impedance characteristic patterns). With the configuration, it is possible to avoid further addition of distortion to the signal, which has been distorted by the vacuum tube amplifier 2, due to the power amplifier 22.

In addition, the load box 10 includes the simulator 211 (corresponding to the generation unit) that generates an audio signal that simulated an audio in a case in which audio based on the audio signal corrected by the equalizer 210 or an audio based on the audio signal obtained by adding an effect to the audio signal corrected by the equalizer 201 is output from the speaker cabinet 4 connected to the power amplifier 22. The simulator 211 generates an audio signal that simulated a condition in which the audio output from the speaker cabinet 4 is collected with the microphone. With this configuration, it is possible to generate the audio signal in a case in which audio is output from the speaker cabinet 4 and the audio signal in a case in which the audio is collected with the microphone and to output and record the generated audio signal even in a case in which no audio is output from the speaker cabinet 4.

In addition, the load box 10 includes a configuration including the input level adjuster 13 (corresponding to the level adjuster) that reduces a signal level of the audio signal output from the reactive load 12, the transmission terminal 15 that transmits the audio signal output from the input level adjuster 13 to the external effector 3, and the reception terminal 16 that receives the audio signal with an effect added by the external effector 3, in which the audio signal received by the reception terminal 16 from the external effector 3 is connected to the equalizer 201. In this manner, it is possible to reduce a level (electric power) of the audio signal with distortion using input level adjuster 13, to add an effect using the external effector 3, and to further improve sound quality using the equalizer 201.

Also, the load box 10 includes the switches 14 and 17 that connect, to the equalizer 201, any of the first signal (the signal input from the input level adjuster 13 to the mixer 18 via the switch 17) that is an audio signal output from the reactive load 12, the second signal (the signal input from the reception terminal 16 to the mixer 18) that is an audio signal received by the reception terminal 16 from the external effector 3, and the third signal obtained through mixing of the first signal and the second signal. In this manner, it is possible to select the type of audio signal to be connected to the equalizer 201. The configurations illustrated in the embodiment can be appropriately combined without departing from the objective.

In the load box according to the disclosure, the correction unit may correct a sound quality of an output signal of the reactive load on the basis of the first impedance characteristic pattern and the second impedance characteristic pattern.

In the load box according to the disclosure, the correction unit may change frequency characteristics of the output signal of the reactive load on the basis of the first impedance characteristic pattern and the second impedance characteristic pattern. The correction unit is, for example, an equalizer.

The load box according to the disclosure may be configured to further include: a power amplifier that amplifies an audio signal corrected by the control unit; and a control unit that controls an amplification rate of the audio signal corrected by the correction unit to an amplification rate at which no distortion is caused by the power amplifier in accordance with a predetermined control input. The predetermined control input is an information indicating a volume of an audio output from the speaker cabinet that is connected to the power amplifier, for example.

The load box according to the disclosure may employ a configuration further including: a loudness correction unit that performs a loudness correction on the audio signal corrected by the correction unit on the basis of an information indicating a volume of an audio output from the speaker cabinet that is connected to the power amplifier.

The load box according to the disclosure may employ a configuration further including: a generation unit that generates an audio signal that simulated an audio in a case in which an audio based on the audio signal corrected by the correction unit is output from a predetermined speaker cabinet.

The load box according to the disclosure may employ a configuration in which an audio signal that simulated an audio in a case in which an audio based on the audio signal corrected by the correction unit is output from a predetermined speaker cabinet and is connected by a microphone is generated.

The load box according to the disclosure may employ a configuration further including: a level adjuster that reduces a signal level of an audio signal output from the reactive load; a transmission terminal that transmits an audio signal output from the level adjuster to an external effector; and a reception terminal that receives an audio signal with an effect added by the external effector, in which the audio signal received by the reception terminal from the external effector is connected to the correction unit.

The load box according to the disclosure may employ a configuration further including: a switch that connects, to the correction unit, any of a first signal that is an audio signal output from the reactive load, a second signal that is an audio signal received by the reception terminal from the external effector, and a third signal that is obtained through a mixing of the first signal and the second signal.

The load box according to the disclosure can employ a configuration further including: a storage unit that is capable of storing a plurality of pieces of setting information related to an effect addition unit that adds an effect to the output signal of the reactive load; and a setting unit (CPU) that reads a setting information corresponding to a setting request from the storage unit and sets the setting information in the effect addition unit. The effect addition unit may be either an external effector that is connected to the load box or an effector incorporated in the load box. However, it is not necessary to provide both the external effector and the incorporated effector, and any one of them may be provided.

Also, the load box according to the disclosure can employ a configuration further including: a storage unit that is capable of storing a plurality of pieces of setting information related to a generation unit that generates at least one of an audio signal that simulated an audio output from a predetermined speaker cabinet that is connected to the load box and an audio signal that simulated an audio in a case in which the audio output from the predetermined speaker cabinet is collected by a microphone; and a setting unit that reads a setting information corresponding to a setting request from the storage unit and sets the setting information in the generation unit.

The load box according to the disclosure can employ a configuration further including: a storage unit that is capable of storing a plurality of pieces of setting information related to a channel control unit of the vacuum tube amplifier; and a setting unit that reads a setting information corresponding to a setting request from the storage unit and sets the setting information in the channel control unit.

The load box according to the disclosure can employ a configuration further including: an effect control unit that acquires, from an external device, a control information related to an effect control unit that adds an effect to the output signal of the reactive load and controls operations of the effect addition unit on the basis of the control information.

The load box according to the disclosure can employ a configuration further including: a channel control unit that controls a channel of the vacuum tube amplifier that is connected to the load box.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A load box, comprising:
a reactive load that outputs an audio signal that responds to an audio signal output from a vacuum tube amplifier with impedance characteristics that simulated impedance characteristics of a speaker cabinet;
an operation element that adjusts the impedance characteristics of the reactive load in a first frequency band into a first impedance characteristic pattern selected from a plurality of first impedance characteristic pattern candidates at least on the basis of a type of the vacuum tube amplifier and adjusts the impedance characteristics of the reactive load in a second frequency band that is higher than the first frequency band into a second impedance characteristic pattern selected from a plurality of second impedance characteristic pattern candidates at least on the basis of the type of the vacuum tube amplifier; and
a correction unit that performs a correction processing on an output signal of the reactive load that has the impedance characteristics including the first impedance characteristic pattern and the second impedance characteristic pattern.

2. The load box according to claim 1, wherein the correction unit corrects a sound quality of the output signal of the reactive load on the basis of the first impedance characteristic pattern and the second impedance characteristic pattern.

3. The load box according to claim 1, wherein the correction unit changes frequency characteristics of the output signal of the reactive load on the basis of the first impedance characteristic pattern and the second impedance characteristic pattern.

4. The load box according to claim 1, further comprising:
a power amplifier that amplifies an audio signal corrected by the correction unit; and
a control unit that controls an amplification rate of the audio signal corrected by the correction unit to an amplification rate at which no distortion is caused by the power amplifier, in accordance with a predetermined control input.

5. The load box according to claim 4, wherein the predetermined control input is an information indicating a volume of an audio output from the speaker cabinet that is connected to the power amplifier.

6. The load box according to claim 4, further comprising:
a loudness correction unit that performs a loudness correction of the audio signal corrected by the correction unit, on the basis of an information indicating a volume of an audio output from the speaker cabinet that is connected to the power amplifier.

7. The load box according to claim 1, further comprising:
a generation unit that generates an audio signal that simulated an audio in a case in which an audio based on the audio signal corrected by the correction unit is output from a predetermined speaker cabinet.

8. The load box according to claim 1, further comprising:
a generation unit that generates an audio signal that simulated an audio in a case in which an audio based on the audio signal corrected by the correction unit is output from a predetermined speaker cabinet and is collected by a microphone.

9. The load box according to claim 1, further comprising:
a level adjuster that reduces a signal level of the audio signal output from the reactive load;
a transmission terminal that transmits an audio signal output from the level adjuster to an external effector; and
a reception terminal that receives an audio signal with an effect added by the external effector,
wherein the audio signal received by the reception terminal from the external effector is connected to the correction unit.

10. The load box according to claim 9, further comprising:
a switch that connects, to the correction unit, any of a first signal that is an audio signal output from the reactive load, a second signal that is an audio signal received by the reception terminal from the external effector, and a third signal that is obtained through a mixing of the first signal and the second signal.

11. A load box comprising:
a reactive load that is connected to a vacuum tube amplifier;
an operation element of the reactive load; and
a correction unit that corrects an output signal of the reactive load in response to an operation of the operation element.

12. The load box according to claim 11, further comprising:
a storage unit that is capable of storing a plurality of pieces of setting information related to an effect addition unit that adds an effect to the output signal of the reactive load; and
a setting unit that reads a setting information corresponding to a setting request from the storage unit and sets the setting information in the effect addition unit.

13. The load box according to claim 11, further comprising:
a storage unit that is capable of storing a plurality of pieces of setting information related to a generation unit that generates at least one of an audio signal that simulated an audio output from a predetermined speaker cabinet that is connected to the load box and an audio signal that simulated an audio in a case in which the audio output from the predetermined speaker cabinet is collected by a microphone; and
a setting unit that reads a setting information corresponding to a setting request from the storage unit and sets the setting information in the generation unit.

14. The load box according to claim 11, further comprising:
a storage unit that is capable of storing a plurality of pieces of setting information related to a channel control unit of the vacuum tube amplifier; and
a setting unit that reads a setting information corresponding to a setting request from the storage unit and sets the setting information in the channel control unit.

15. The load box according to claim 11, further comprising:
an effect control unit that acquires, from an external device, a control information related to an effect addition unit that adds an effect to the output signal of the reactive load and controls operations of the effect addition unit on the basis of the control information.

16. The load box according to claim 11, further comprising:
a channel control unit that controls a channel of the vacuum tube amplifier that is connected to the load box.

17. A sound quality improving method comprising:
outputting a signal that responds to an audio signal by using a reactive load,
wherein the audio signal is output from a vacuum tube amplifier in accordance with impedance characteristics in which the impedance characteristics simulated impedance characteristics of a speaker cabinet, the reactive load has the impedance characteristics in which impedance characteristics in a first frequency band include a first impedance characteristic pattern selected from a plurality of first impedance characteristic pattern candidates on the basis of a type of the vacuum tube amplifier, and impedance characteristics in a second frequency band that is higher than the first frequency band include a second impedance characteristic pattern selected from a plurality of second impedance characteristic patterns on the basis of the type of the vacuum tube amplifier; and
performing a correction on an output signal of the reactive load.

18. The sound quality improving method according to claim 17, wherein the correction corrects a sound quality of the output signal of the reactive load on the basis of the first impedance characteristic pattern and the second impedance characteristic pattern.

19. The sound quality improving method according to claim 17, wherein the correction changes frequency characteristics of the output signal of the reactive load on the basis of the first impedance characteristic pattern and the second impedance characteristic pattern.

20. The sound quality improving method according to claim 17, further comprising:
a power amplifier that amplifies an audio signal corrected by the correction; and
a control unit that controls an amplification rate of the audio signal corrected by the correction to an amplification rate at which no distortion is caused by the power amplifier, in accordance with a predetermined control input.

* * * * *